(12) United States Patent
Kim

(10) Patent No.: US 7,796,238 B2
(45) Date of Patent: Sep. 14, 2010

(54) PHOTOLITHOGRAPHY EQUIPMENT HAVING WAFER PRE-ALIGNMENT UNIT AND WAFER PRE-ALIGNMENT METHOD USING THE SAME

(75) Inventor: Hee-Hwan Kim, Muju-gun (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 736 days.

(21) Appl. No.: 11/698,942

(22) Filed: Jan. 29, 2007

(65) Prior Publication Data

US 2007/0177120 A1  Aug. 2, 2007

(30) Foreign Application Priority Data

Feb. 1, 2006  (KR) ...................... 10-2006-0009854

(51) Int. Cl.
*G03B 27/42* (2006.01)
(52) U.S. Cl. .......................................... 355/53; 355/77
(58) Field of Classification Search .................. 355/30, 355/53, 77; 356/138, 399–401, 614
See application file for complete search history.

(56) References Cited

U.S. PATENT DOCUMENTS

2001/0028456 A1* 10/2001 Nishi .......................... 356/400
2006/0050274 A1* 3/2006 Matsumoto et al. ......... 356/401

FOREIGN PATENT DOCUMENTS

| JP | 2001-044093 | 2/2001 |
| KR | 1998-0003888 | 3/1998 |
| KR | 1020030087732 A | 11/2003 |
| KR | 10-2005-0098963 | 10/2005 |

* cited by examiner

*Primary Examiner*—Edward J Glick
*Assistant Examiner*—Mesfin T Asfaw
(74) *Attorney, Agent, or Firm*—Volentine & Whitt, PLLC

(57) ABSTRACT

Exposure equipment having a wafer pre-alignment apparatus and a wafer pre-alignment method using the same reduce wafer pre-alignment errors. The exposure equipment comprises a plurality of exposure units in which lots of wafers are loaded, respectively, and a central control unit. The exposure units are constituted by an alignment apparatus that can detect the relative angular orientation of each wafer transferred to the apparatus and thus, sense any misalignment of the wafers. The central control unit calculates inherent error values for the exposure units based on data transmitted to the central control unit from the alignment apparatus. The central control unit also controls the equipment based on the inherent error values of the exposure units to compensate for the misalignment of the wafers in the exposure units.

10 Claims, 6 Drawing Sheets

FIG. 1A
(CONVENTIONAL)
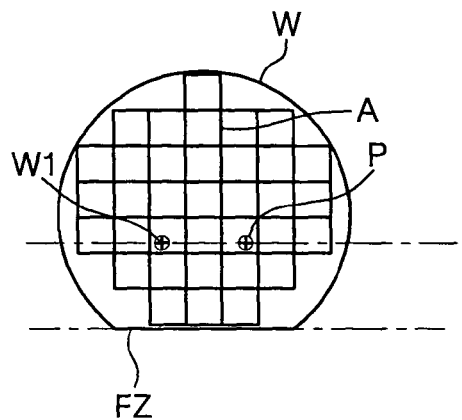
FIG. 1B
(CONVENTIONAL)
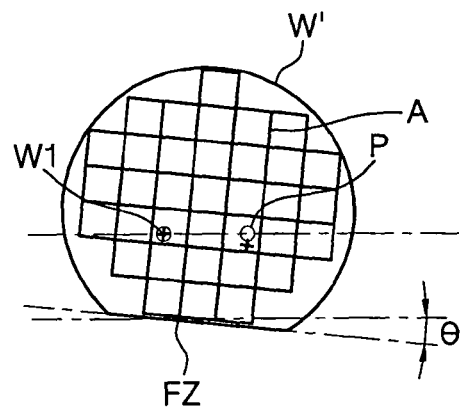

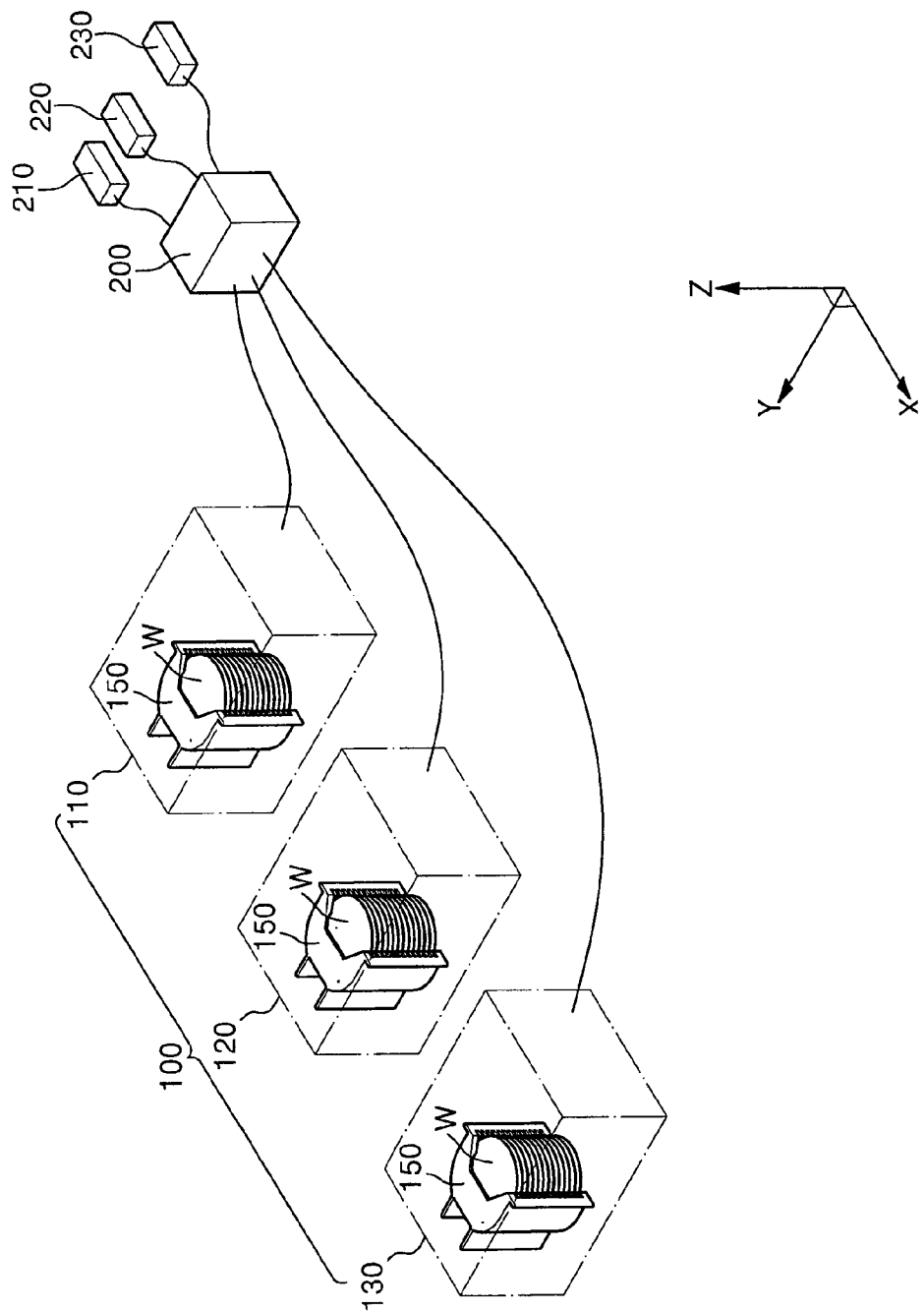

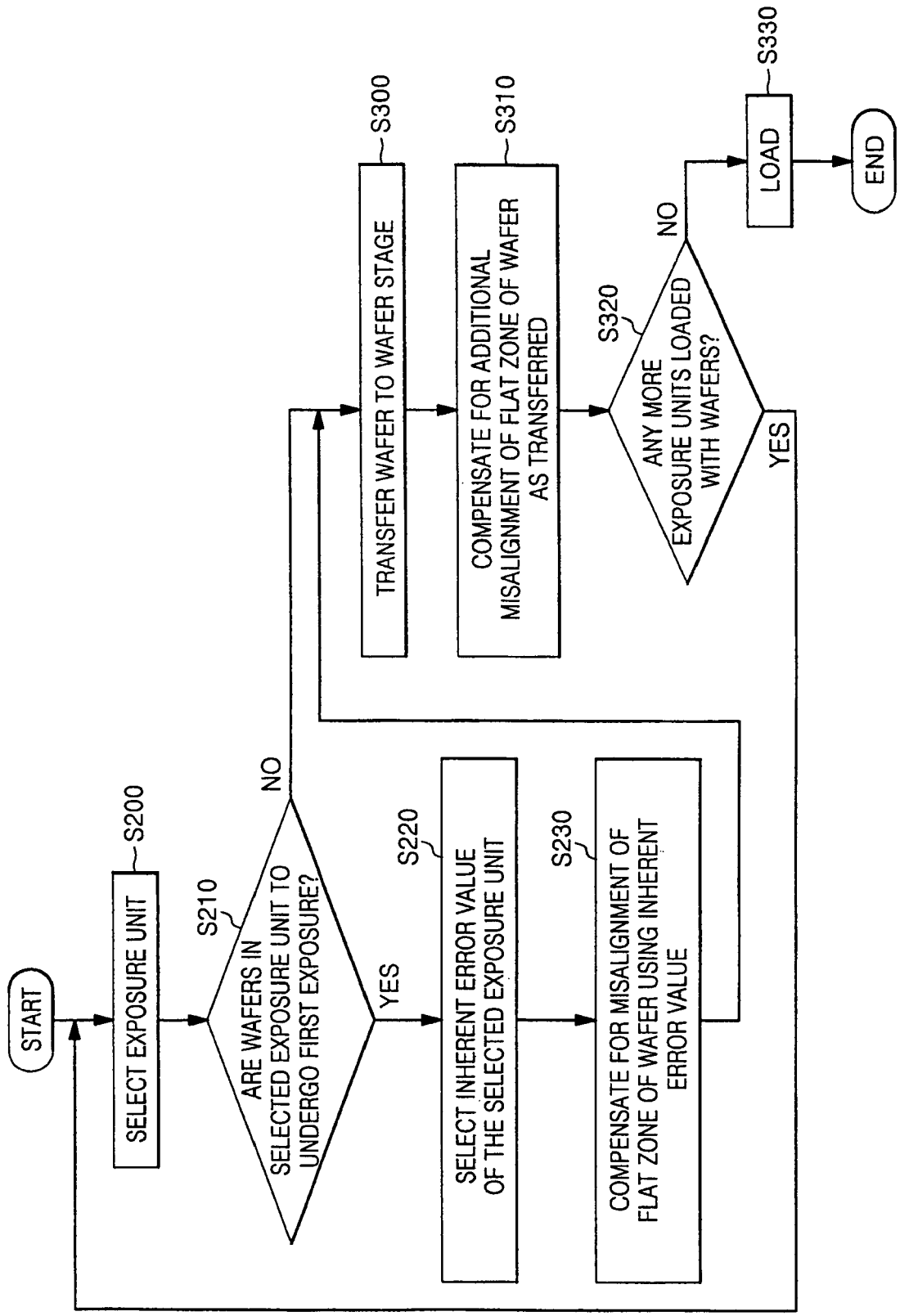

PHOTOLITHOGRAPHY EQUIPMENT HAVING WAFER PRE-ALIGNMENT UNIT AND WAFER PRE-ALIGNMENT METHOD USING THE SAME

BACKGROUND OF INVENTION

1. Field of the Invention

The present invention relates to photolithography equipment. More particularly, the present invention relates to photolithography equipment having an exposure apparatus and a wafer pre-alignment apparatus for aligning wafers with the optics of the exposure apparatus. The present invention also relates to a method of aligning wafers with the optics of the exposure apparatus of photolithography equipment.

2. Description of the Related Art

The fabricating of semiconductor devices includes a process of coating an upper surface of a wafer with photoresist (hereinafter, referred to "PR") to form a layer of PR having a predetermined thickness on the wafer, a process of exposing the layer of PR to the image of a pattern such as a circuit pattern, a process of developing the exposed layer of PR to thereby pattern the layer of PR, and a process of etching the surface lying under the patterned layer of PR. As a result, a pattern, namely the circuit pattern, is formed on the wafer. The exposure process entails transmitting light onto the wafer through a reticle bearing a pattern corresponding to the desired pattern to be formed on the wafer. Accordingly, an image of the desired pattern is transferred to the wafer. Thus, in the exposure process, it is very important to align the wafer precisely with the reticle. Recently, 25 or 50 wafers are being fabricated by lot into the same type of memory device. For example, 100 wafers may be divided into four lots each according to a different type of memory device that is to be fabricated. Thus, the wafers of any one lot are all subjected to the same exposure process sequentially and selectively. Therefore, it is also important to align each wafer of the lot precisely with the optics of the exposure apparatus and, in particular, with the reticle so that the memory devices are not only of good quality but have uniform characteristics.

In general, the wafers are aligned in two stages. The first stage is a pre-alignment process in which a flat zone of the wafer is used to orient the wafer in a certain direction before the wafer is transferred to a wafer stage of the exposure apparatus. There, a desired pattern and an alignment mark are formed on the wafer using a first reticle (hereinafter, the pre-alignment will be referred to as the "first alignment process"). The second stage is an alignment process in which the wafer is aligned using the wafer stage and the alignment mark (hereinafter, referred to as the "second alignment process") once the wafer has been transferred to the exposure apparatus. Subsequently, a desired circuit pattern is formed on the wafer using a reticle different from the first reticle.

An example of the first alignment process has been disclosed in Korean Patent Laid-Open Publication No. 2003-0087732 (laid-open on Nov. 5, 2003). This publication discloses a technique of checking the relative angular position of each wafer and compensating for deviations of the position from a desired position. However, completing the first alignment process using this technique for an entire lot or for several lots of wafers would require a great amount of time because the relative angular positions of the each of the wafers would have to be individually checked and adjusted, if necessary.

A conventional method of aligning wafers, when the wafers are grouped together in lots, is to use the first wafer subjected to the first alignment process as a reference wafer for all of the other wafers that are subsequently pre-aligned. More specifically, the pre-alignment unit detects the relative position of the flat zone of a first wafer loaded into the unit. The angle by which the first wafer is misaligned is calculated by a control unit based on the detected relative position of the flat zone. The calculated angle is stored as misalignment data in the control unit. The control unit then controls the pre-alignment unit based on the misalignment data to adjust the relative position of the first wafer so that the misalignment is compensated for.

In the conventional method, the reference misalignment data generated using the first wafer loaded into the pre-alignment unit is used as a reference angle. That is, this data is applied to the remaining wafers of the lot to pre-align the remaining wafers. However, not all of the wafers in a lot are transferred to the pre-alignment unit with exactly the same orientation. Thus, at least one or more wafers may be misaligned when the first alignment process is carried out using only the reference misalignment data to control the operation of the pre-alignment unit.

In this case, an alignment mark detection unit of the exposure apparatus fails to find the alignment mark on one or more of the wafers during the second alignment process. In this respect, FIG. 1A shows a wafer W that is transferred to the exposure apparatus after the first alignment process has been performed properly. That is, the flat zone FZ of the wafer W faces in a desired predetermined direction. In this case, the detection unit P immediately finds the alignment mark W1. Reference "A" denotes an imaginary grid that maps out the exposure regions or shots of the wafer W. On the other hand, FIG. 1B shows a wafer W' that is misaligned when it is transferred to the exposure apparatus. In this case, the relative angular position of the wafer W' deviates from the correct orientation by an angle θ.

In the case of the misaligned wafer W' as shown in FIG. 1B, an operator needs to manipulate the exposure apparatus so that the detection unit P finds the alignment mark W1. That is, an additional alignment process needs to be performed when the wafer W' is still misaligned after the first alignment process. Accordingly, the conventional alignment process may require a rather large amount of time to complete, especially with respect to a lot of wafers and thus, can be characterized as a low yield process.

SUMMARY OF THE INVENTION

Therefore, an object of the present invention is to provide exposure equipment and a wafer pre-alignment method using the same, by which wafers can be pre-aligned accurately and within a relatively short amount of time.

Another object of the present invention is to provide exposure equipment and a wafer pre-alignment method using the same, by which alignment marks formed on wafers will be readily picked up when the pre-aligned wafers arrive at an exposure apparatus, whereby time is not spent by the exposure apparatus in searching for the alignment marks prior to an exposure process and, as a result, a high level of production is achieved.

To achieve these objects, a lot of wafers is loaded into an exposure unit, and an average value of the angles by which the relative angular positions of the wafers deviate from a reference position is calculated and assigned to the exposure unit as its inherent error value. Then, the orientation of each of the wafers is adjusted based on the inherent error value. This process may be applied to each of several different lots of wafers in sequence. The different sections of the equipment into which the lots are respectively loaded each constitute a respective exposure unit. Thus, a respective inherent error value is derived for each of the exposure units.

According to one aspect of the present invention, the present invention provides photolithographic exposure equipment comprising a plurality of exposure units including a wafer alignment apparatus, and a central control unit including a processor configured to calculate an inherent error value for each of the exposure units and to selectively apply these values to the aligning of wafers by the alignment apparatus.

The alignment apparatus has a sensor operative to detect the relative angular position of a wafer loaded into the exposure unit, and a rotary chuck. Each of the exposure units is also constituted by an exposure apparatus. The exposure apparatus includes a wafer stage, a light source, and a reticle stage optically interposed between the light source and the wafer stage.

The central control unit is operatively connected to the sensor so as to receive data from the sensor representative of the relative angular position of each wafer transferred to the alignment apparatus. The processor of the central control unit is configured to calculate a respective inherent error value for each of the exposure units from a sum of data received from the sensor after a number of wafers have been transferred in the exposure unit to the alignment apparatus. Preferably, the processor of the central control unit is configured to average values of the data received from the sensor.

The central control unit also has a memory in which the respective inherent error values of the exposure units are correlated with the exposure units and stored. The central control unit also has a controller operatively connected to the rotary chuck of the alignment apparatus, i.e., through a motor, so as to selectively rotate the chuck by an amount corresponding to the inherent error value of an exposure unit when a wafer is transferred in the exposure unit onto the rotary chuck.

Preferably, the rotary chuck of the alignment apparatus is a first vacuum chuck, and the sensor is operative to detect the flat zone of a wafer transferred onto the first vacuum chuck and to transmit to the central control unit data representative of an angle by which the flat zone of the wafer is misaligned with respect to a reference position. Also, the exposure units comprise wafer carriers, respectively. Each of the wafer carriers is configured to support a plurality of wafers, and the exposure units are also each constituted by a first wafer transfer device having a working envelope that encompasses a respective one of the wafer carriers and the first vacuum chuck. Thus, the first wafer transfer device is operative to sequentially transfer wafers one-by-one in the exposure unit from the respective wafer carrier of the exposure unit to the wafer alignment apparatus.

In addition, the exposure apparatus may further comprise a second sensor operative to detect the flat zone of a wafer transferred onto the wafer stage and operatively connected to the central control unit to transmit to the central control unit data representative of an angle by which the flat zone of the wafer is misaligned with respect to reference position. In this case, the wafer stage of the exposure apparatus comprises a second vacuum chuck, and a second motor operatively connected to the central control unit and to the second vacuum chuck so as to rotate the second vacuum chuck under the control of the central control unit.

According to another aspect of the present invention, the present invention provides a wafer pre-alignment method in which an inherent error value is calculated for and assigned to an exposure unit, and wafers are pre-aligned based on the inherent error value.

The wafers are transferred one-by-one from a standby location in the exposure unit to an alignment apparatus of the exposure unit. There, the relative angular positions of the wafers are detected, respectively. Also, the alignment apparatus is controlled to adjust the relative angular positions of each of the wafers by respective amounts necessary to set each of the wafers in the same relative angular position. Accordingly, any misalignment of the wafers with respect to a reference position is first compensated for. Each of the wafers is returned to the standby location after any misalignment thereof with respect to the reference position is first compensated for. Then the inherent error value for the exposure unit is calculated based on the relative angular positions of the wafers detected when the wafers are at the alignment apparatus.

Subsequently, the wafers are transferred in the exposure unit from the standby location back to the alignment apparatus, and the alignment apparatus is controlled to adjust the orientation of the wafers each by an amount corresponding to the inherent error value calculated for the exposure unit. Accordingly, misalignment of the wafers with respect to the reference position is secondly compensated for.

According to another aspect of the present invention, the present invention provides a wafer pre-alignment method in which inherent error values are calculated for and assigned to several exposure units, respectively, and wafers in each exposure unit are pre-aligned based on the inherent error value calculated for and assigned to that exposure unit.

The wafers are grouped in lots and the lots are loaded into a plurality of exposure units, respectively. Preferably, in this respect, each lot of wafers is disposed at a loading station, i.e., at a standby location, as accommodated in a respective wafer carrier such as a wafer cassette. The wafers are then transferred one-by-one from the respective standby location in a selected exposure unit to an alignment apparatus. The relative angular positions of the wafers are detected at the alignment apparatus, respectively, and an inherent error value for the selected exposure unit is calculated based on the detected relative angular positions of the wafers.

Subsequently, the orientations of the wafers in the selected exposure unit are each adjusted by an amount corresponding to the inherent error value calculated for the exposure unit. Accordingly, any misalignment of the wafers in the selected exposure unit with respect to the reference position is compensated for. The process is repeated for each of the other exposure units. Therefore, respective inherent error values are calculated for each of the exposure units, and the wafers in each of the exposure units are pre-aligned by amounts each corresponding to the inherent error value calculated for the exposure unit.

Preferably, in an alignment method according to the present invention, the orientations of the flat zones of the wafers are detected at the alignment apparatus to detect the relative angular positions of the wafers. In this case, the inherent error value of an exposure unit is calculated by averaging values of angles by which the flat zones of the wafers deviate from a reference position. An alignment method according to the present invention may further comprise determining whether the wafers in an exposure unit are to undergo a first exposure process before the wafers are transferred from the standby location. The first exposure process is one in which images of both a desired (circuit) pattern and an alignment mark are transferred to the wafer.

In addition, the method may further comprise sequentially transferring the wafers to a wafer stage of an exposure apparatus of the exposure unit after the orientation of the wafers has been adjusted by the alignment apparatus, detecting the relative angular positions of the wafers on the wafer stage, respectively, and controlling the exposure apparatus to adjust the relative angular positions of each of the wafers on the wafer stage based on this detection before the first exposure process is carried out on each of the wafers. Accordingly, any misalignment of the wafers with respect to a reference position is thirdly compensated for at the wafer stage of the exposure apparatus.

BRIEF DESCRIPTION OF THE DRAWINGS

The above and other objects, features and advantages of the present invention will become more apparent to those of ordinary skill in the art by referring to the following detailed description of the preferred embodiments thereof made with reference to the attached drawings in which:

FIG. 1A is a plan view of a wafer having a flat zone and which is properly aligned when it is transferred to a conventional exposure apparatus;

FIG. 1B is a plan view of a wafer that is misaligned when it is transferred to a conventional exposure apparatus;

FIG. 2 is a perspective view of an embodiment of photolithographic equipment according to the present invention;

FIG. 6 is a flow chart of a wafer pre-alignment method according to the present invention.

DETAILED DESCRIPTION OF THE PREFERRED EMBODIMENTS

The photolithographic exposure equipment of the present invention will now be described more fully hereinafter with reference to FIGS. 2 through 4.

Referring to FIG. 2, the exposure equipment includes a plurality of wafer exposure units 100, and a central control system 200 operatively connected to each of the wafer exposure units 100 (described in detail later with reference to FIG. 3). The number of wafer exposure units 100 corresponds to the number of different types of devices, e.g., memory devices such as 256 MB DDR or 512 MB DDR, that are to be fabricated. That is, the photolithographic exposure equipment can process several lots of wafers at a time. Each lot will contain 25 or 50 wafers, for example, and which wafers will be sequentially subjected to the same exposure process.

Figure 3:
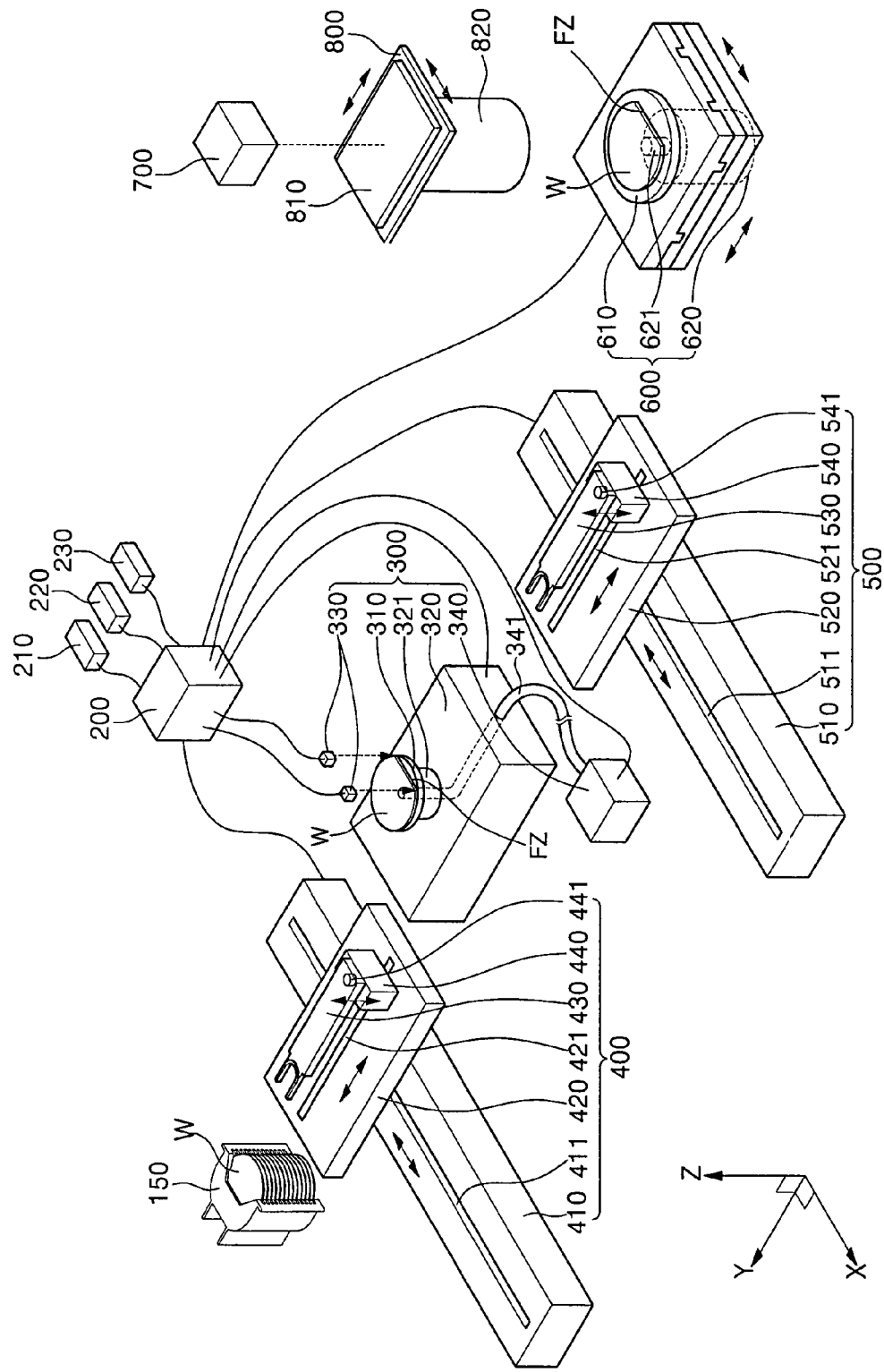
FIG. 3 is a perspective view of an exposure unit and the central control unit of the photolithographic equipment of FIG. 2.

Referring now to FIG. 3, each wafer exposure unit 100 is constituted by a wafer carrier (wafer cassette) 150 configured to support the wafers W at a respective standby location, a flat zone alignment apparatus 300, a first wafer transfer device 400 for transferring the wafers W from the carrier 150 to the flat zone alignment unit 300, an exposure apparatus (described in more detail below), and a second wafer transfer device 500 for transferring the wafers W from the flat zone alignment apparatus 300 to the exposure apparatus.

The flat zone alignment apparatus 300 includes a first vacuum chuck 310 for holding each wafer W transferred to the apparatus 300 by the first wafer transfer device 400, a first motor 320 having a first rotary output shaft 321 connected to the bottom of the first vacuum chuck 310, and a first sensor 330 electronically connected to the central control unit 200. As will be described in more detail later on, the first sensor 330 can sense the flat zone FZ of a wafer W held by the vacuum chuck 310 and transmit data representative of the relative position or orientation of the flat zone FZ to the central control unit 200. The flat zone alignment apparatus 300 also includes a vacuum unit 340, and a vacuum line 341 connecting the vacuum unit 340 to the first vacuum chuck 310.

The first wafer transfer device 400 includes a first rail 410, a second rail 420 extending orthogonally to the first rail 410 and movable longitudinally along the first rail 410 in the direction of an X-axis, and a wafer arm 430 supported on the second rail 420 so as to be movable longitudinally along the second rail 420 in the direction of a Y-axis. The wafer arm 430 is also pivotable about a Z-axis extending orthogonally to the X-Y plane. More specifically, the first rail 410 extends longitudinally in the direction of an X-axis and has a guide slot 411 extending therealong in the direction of an X-axis. The second rail 420 is received in the guide slot 411 of the first rail 410 and is thereby guided for movement along the first rail 410 in the direction of the X-axis. The second rail 420 extends longitudinally in the direction of the Y-axis and has a slot 421 extending longitudinally therealong in the direction of the Y-axis. A cylinder 440 is received in the slot 421 of the second rail 420 so as to be move with the second rail in the direction of the X-axis and so as to be movable in the direction of the Y-axis independently of the second rail 420. The wafer arm 430 is supported by the cylinder 440 via a pivot pin 441. The wafer arm 430 is movable by the cylinder 440 up and down in the direction of a Z-axis perpendicular to the X-Y plane and is rotatable about the Z-axis, i.e., in the X-Y plane. The working envelope of the first wafer transfer device 400 thus encompasses at least the wafer carrier 150 and the alignment apparatus 300.

The second wafer transfer device 500 has the same construction as the first wafer transfer device 400. Thus, the second wafer transfer device 500 has first rail 510 having a first guide slot 511 extending in the direction of the X-axis, a second rail 520 extending orthogonally to the first rail 510 and movable longitudinally along the first rail 510 in the direction of the Y-axis, a cylinder 540 movable along the second rail 520 in the direction of the Y-axis, and a wafer arm 530. The wafer arm 530 is supported by a pivot pin 541 on the cylinder 540. Thus, the wafer arm 530 is movable in the direction of a Y-axis, is movable up and down along the Z-axis, and is pivotable about the Z-axis. The working envelope of the second wafer transfer device 500 thus encompasses the wafer alignment apparatus 300 and the exposure apparatus.

The exposure apparatus includes a wafer stage 600 on which the wafer W is set, a light source 700 disposed above the wafer stage 600, and a reticle stage 800 interposed between the wafer stage 600 and the light source 700. A reticle 810 bearing a pattern corresponding to a desired pattern to be formed on the wafer W is supported by the reticle stage 800. The wafer stage 600 includes X-axis and Y-axis stage sections movable in the directions of the X- and Y-axes, respectively, as indicated by the double-headed arrows, a vacuum chuck 610 mounted to the stage sections for fixing the wafer W in place on one of the stage sections, and a second motor 620 having a second rotary output shaft 621 connected to the bottom of the second vacuum chuck 610 for rotating the second vacuum chuck 610.

The central control unit 200 receives the data transmitted by the sensor 330 of the flat zone alignment apparatus 300 of the wafer exposure unit 100, and uses the data to calculate a value that represents the angle that the flat zone of the wafer deviates from the properly aligned position. This value thus represents an inherent flaw in each of the exposure units 100. A sum of this data is used to quantify the inherent flaw as an "inherent error value". On the basis of the inherent error value, the central control unit 200 adjusts the orientation of the wafers transferred to the flat zone alignment apparatus 300 from the first transfer device 400 to compensate for any misalignment of the wafers due to the inherent flaw of the exposure unit 100. To this end, the central control unit 200 includes a selection control section 210 comprising an electronic controller, a statistical processing unit 220 comprising a data processor, and a determination control section 230 also comprising an electronic controller.

More specifically, the selection control section 210 of the central control unit stores the inherent error values of all of the pre-alignment apparatuses 100, respectively, selects the inherent error value associated with the exposure unit 100 that is in use, and transmits an electrical signal to the flat zone alignment apparatus 300 that controls the operation of the flat zone alignment apparatus 300 to compensate for the inherent flaw of the exposure unit 100.

The statistical processing unit 220 receives data from the sensor 330 of the flat zone alignment unit 300 for a predetermined number of wafers accommodated by each exposure unit 100, and calculates an inherent error value for the exposure unit 100 by averaging the data. The statistical processing unit 220 then stores the inherent error value in a memory of the central control unit 200. Accordingly, the average of several angles, each corresponding to the deviation of the flat zone of a wafer from a reference position where the flat zone should lie if the wafer were properly aligned, becomes the inherent error value of an exposure unit 100. Also, the inherent error value of each exposure unit 100 is stored in the central control unit 200.

The determination control unit 230 determines whether the wafers W accommodated by an exposure unit 100 are to undergo the first exposure process. If not, the determination control unit 230 controls the equipment to select another exposure unit 100. In other words, the determination control unit 230 sets the sequence by which the alignment process is carried out on the lots of wafers.

The wafer stage 600 may also include a second sensor (not shown) for sensing the flat zone FZ of a wafer W held by the second vacuum chuck 610, and transmitting data representing any further deviation of the flat zone FZ of the wafer to the central control unit 200 (thereby taking into account any inherent flaw in the second transfer device 500 of the pre-alignment apparatus). In this case, the data is used to calculate an inherent error value and the second motor 620 is operated by the central control unit 200 on the basis of the inherent error value to rotate the wafer prior to the first exposure process.

The operation and effect of the exposure equipment having several wafer exposure units 100 according to the present invention will now be described in more detail. For purposes of explanation, the exposure units 100 shown in FIG. 2 will be designated as a first exposure unit 110, a second exposure unit 120 . . . and an $n^{th}$ exposure unit 130, wherein n is the total number of exposure units of the equipment. Each exposure unit is used to pre-align and expose a lot of 25 wafers W, for example.

The selection control unit 210 selects any one of the first, second, and . . . $n^{th}$ exposure units 110, 120, and . . . 130. For example, when the first exposure unit 110 is selected, the selection control unit 210 transmits an electrical signal to the first wafer transfer device 400. Subsequently, the first wafer transfer device 400 removes a wafer W from the carrier 150 of the first exposure unit 110, and sets the wafer on the first vacuum chuck 310 of the flat zone alignment apparatus 300. At this time, the first sensor 330 detects both ends of the flat zone of the wafer W held by the first vacuum chuck 310. That is, as is shown in FIG. 4, the first sensor 330 determines coordinates $(-X_1, Y_0)$ and $(X_2, Y_1)$ of both ends of the flat zone FZ. The coordinates $(-X_1, Y_0)$ and $(X_2, Y_1)$ thus define the relative position of the flat zone of the wafer W. The coordinates are transmitted to the statistical processing unit 220.

Figure 4:
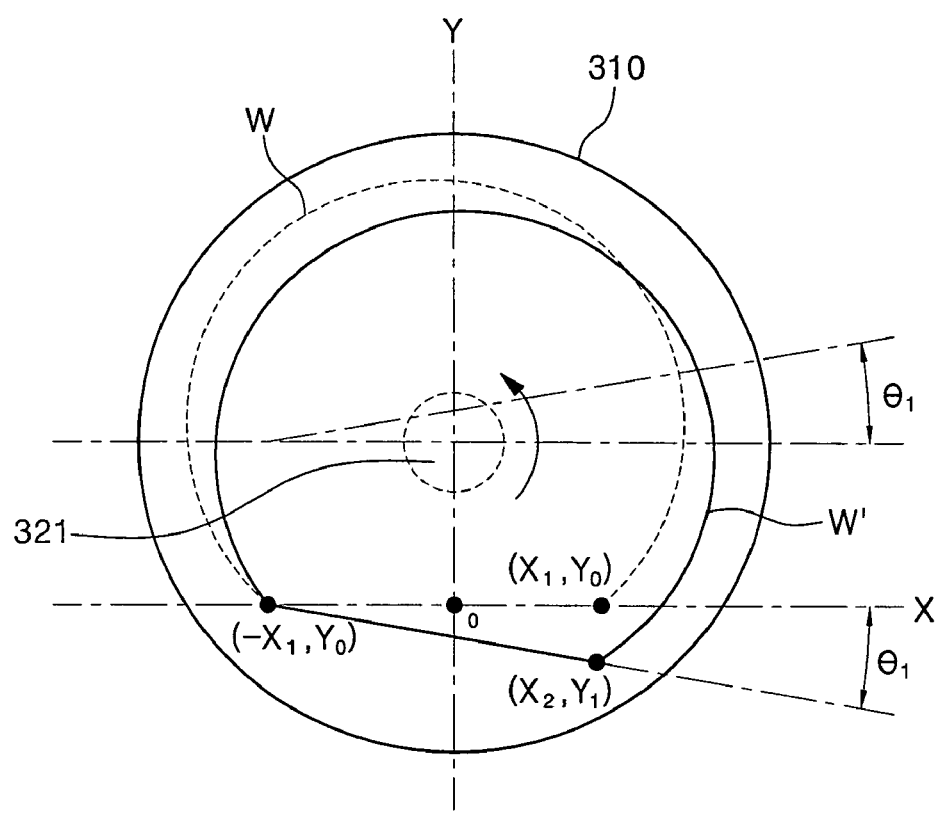
FIG. 4 is a plan view of a wafer for use in illustrating a method of pre-aligning the wafer using the equipment shown in FIGS. 2 and 3 according to the present invention.

The statistical processing unit 220 compares preset reference coordinates, i.e., $(-X_1, Y_0)$ and $(X_1, Y_0)$ as shown in FIG. 4, and the coordinates $(-X_1, Y_0)$ and $(X_2, Y_1)$ that define the relative position of the flat zone of the wafer W. Then, the statistical processing unit 220 calculates a misalignment angle $\theta 1$ of the flat zone FZ of the wafer W, and stores it in a memory. Accordingly, rotating the wafer W over the misalignment angle $\theta 1$ will reconcile the coordinates $(-X_1, Y_0)$ and $(X_2, Y_1)$ of the detected position of the flat zone and the reference coordinates $(-X_1, Y_0)$ and $(X_1, Y_0)$.

That is, the statistical processing unit 220 transmits a driving signal to the first motor 320 that causes the first rotary output shaft 321 of the first motor 320 and hence, the first vacuum chuck 310 connected to the first rotary output shaft 321, to rotate. Preferably, the first rotary output shaft 321 is rotated in a direction that best compensates for the misalignment of the wafer, i.e., the first rotary output shaft 321 is rotated counterclockwise as indicated by the arrow in FIG. 4.

Consequently, the wafer W held by the first vacuum chuck 310 rotates counterclockwise. The first sensor 330 detects, in real-time, the ends of the flat zone FZ of the rotating wafer W and determines the coordinates of the ends of the flat zone FZ of the wafer W, respectively. The central control unit 200 stops the operation of the first motor 320 when the coordinates correspond to the reference coordinates $(-X_1, Y_0)$ and $(X_1, Y_0)$. Thus, the wafer W is held by the first vacuum chuck 310 in a pre-aligned state in which the flat zone FZ of the wafer faces in a predetermined direction.

Subsequently, the wafer W is transferred by the first wafer transfer device 400 and may be loaded back into the carrier 150 of the first exposure unit 110. Then, the first wafer transfer device 400 removes the next wafer from the wafer support 150 of the first exposure unit 110, and sets the wafer on the wafer chuck 310. As a result, the statistical processing unit 220 calculates the misalignment angle $\theta$ of the flat zone of the wafer, stores a value of the misalignment angle $\theta$ in its memory, controls the motor 321 to rotate the wafer until the coordinates of the flat zone of the wafer correspond to the reference coordinates $(-X_1, Y_0)$ and $(X_1, Y_0)$. The wafer is then transferred by the wafer transfer device 400 back to the carrier 150 of the first exposure unit 110. This process is repeated for all of the wafers remaining in the lot.

Thus, values of the misalignment angles of the flat zones FZ of all of the 25 wafers W are stored in the memory of the statistical processing unit 220. The statistical processing unit 220 averages the values of misalignment angles and stores the result in the central control unit 200. That is, the average value of the misalignment angles is the inherent error value for the first exposure unit 110.

Subsequently, the statistical processing unit 220 calculates the inherent error values $\theta 2, \ldots \theta n$ of the second exposure unit 120 through the $n^{th}$ exposure unit 130, respectively, in the same manner as for the first exposure unit 110. The statistical processing unit 220 stores the inherent error values in the central control unit 200 as correlated with the exposure units.

The central control unit 200 thus adopts the inherent error value of the first, second, or $n^{th}$ exposure unit 110, 120, . . . or 130, from among the stored inherent error values $\theta 1, \theta 2, \ldots$ and $\theta n$, whenever a wafer W associated with that particular exposure unit 110, 120, . . . or 130 is selected by the selection control unit 210 for undergoing the first exposure process.

More specifically, after an inherent error value of a exposure unit 110, 120, . . . or 130 is calculated as described above, the central control unit 200 commands the first wafer transfer device 400 to withdraw a wafer W from the wafer carrier 150 of a exposure unit 110, 120, . . . or 130 and set the wafer W on the wafer chuck 310 of the wafer flat zone alignment unit 300. The wafer W is then rotated by an angle corresponding to the inherent error value of the exposure unit 110, 120, . . . or 130. Accordingly, the inherent flaw in the exposure unit 110, 120, . . . or 130 is compensated for (second compensation). The central control unit 200 then commands the second wafer transfer unit 500 to set the wafer W on the wafer stage 600. Then, the first exposure process is performed on the wafer W.

That is, the light source 700 emits light of a predetermined wavelength. The light passes through the reticle 810 and is projected onto the upper surface of the wafer W by a projection optical system 820. The reticle 810 bears a pattern corresponding to a desired a circuit pattern, for example, and to an alignment mark (see W1 in FIG. 1A) for aligning the wafer W during a second exposure process. The wafer W is coated with a layer of photoresist PR. Thus, images of the circuit pattern and alignment mark are transferred to a region of the wafer W. This process can be repeated by a step and scan operation, for example, so that the circuit pattern and alignment mark can be formed at regular intervals on the wafer.

Note, as mentioned previously, the orientation of the flat zone FZ of the wafer can be sensed on the wafer stage 600 before the first exposure process is carried out, data representative of any misalignment of the wafer at this time can be relayed to the central control unit 200, and an inherent error value can be calculated using such data. The wafer can thus be further aligned, i.e., after being pre-aligned using the flat zone alignment apparatus 300, to thereby further reduce inherent alignment errors such as those caused by the transfer of the wafer to the stage 600 by the second wafer transfer device 500.

In any case, the wafer W is transferred by the second wafer transfer device 500 from the wafer stage 600 after the first exposure process has been completed. The central control unit 200 then controls the equipment to perform the same process with respect to the remaining wafers W loaded in the carrier 150 of the first exposure unit 110. When the pre-alignment and first exposure of the remaining wafers are completed, the central control unit 200 controls the equipment to pre-align and expose the wafers W with respect to the remaining exposure units, i.e., the second, . . . $n^{th}$ exposure units 120, . . . and 130, sequentially and in the same manner as described above in connection with the first exposure unit 110.

Next, another aspect of the method of pre-aligning the wafers according to the present invention will be described with reference to the flow charts of FIGS. 5 and 6.

Figure 5:
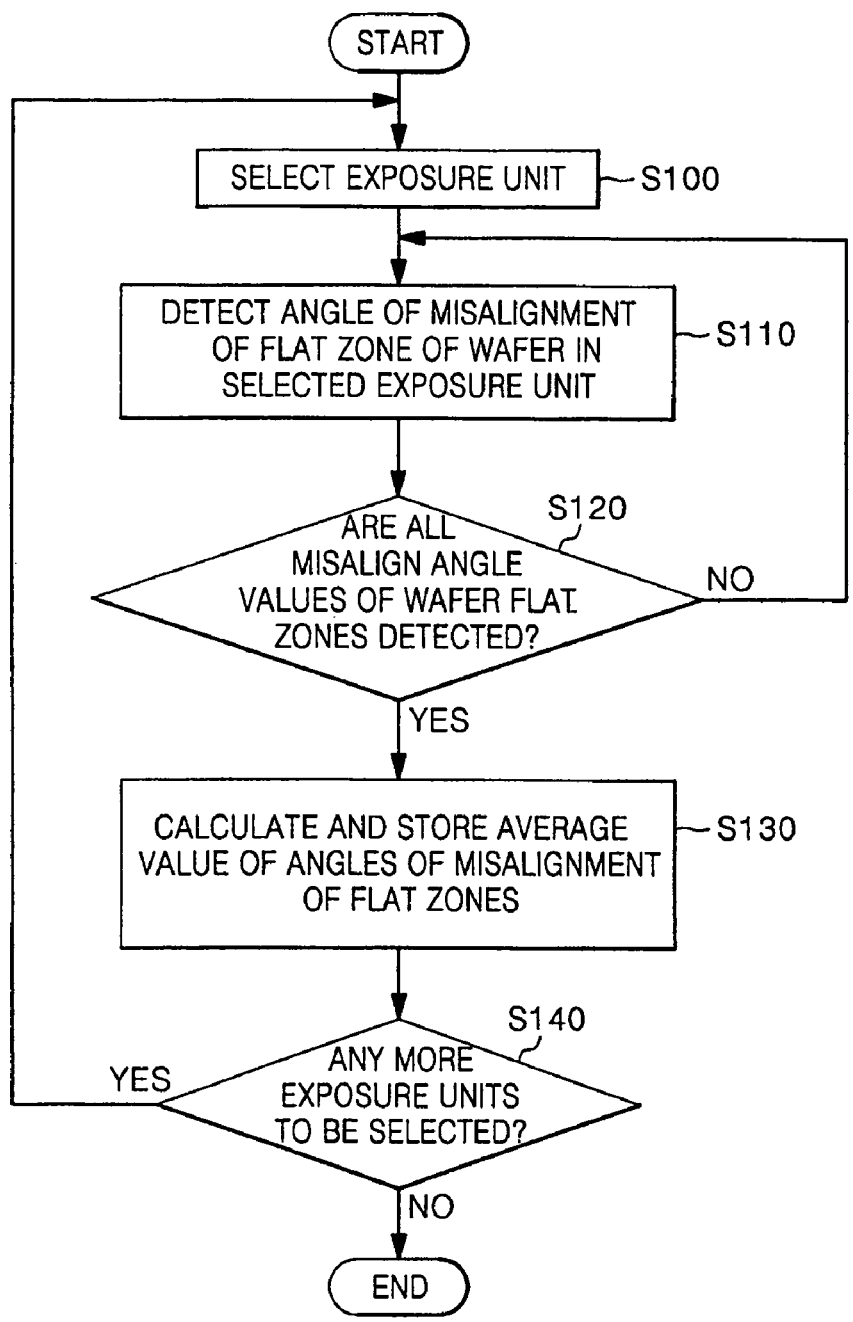
FIG. 5 is a flow chart of a process of calculating an inherent error value of each exposure apparatus.

Referring first to FIG. 5, one of the exposure units 100 is selected (S100). The angle by which the flat zone of a wafer in the selected exposure unit 100 is misaligned is detected (S110). The values of the angles of misalignment are averaged (S120) once the angles of misalignment of the flat zones of all the wafers W are detected. The average value of the angles of misalignment is stored as an inherent error value in the central control unit 200 (S130). Then, the control unit 200 determines whether there are any other exposure units 100 having wafers that have not yet been analyzed to determine the inherent error value of the unit (S140). If yes, one such an exposure unit 100 is selected and the above-described process is performed. If no, the pre-alignment process ends. At this time, the respective inherent error values of all of the exposure units 100 are stored in the central control unit 200.

Referring to FIGS. 2, 4 and 6, the selection control unit 210 sequences the exposure units 100 and selects a first exposure unit 100 in the sequence (S200). Then, a determination is made as to whether the wafers W in the first exposure unit 110 are to undergo a first exposure process in which the image of a circuit pattern or the like and the image of an alignment mark are to be transferred to the wafers in the first exposure unit 100 (S210).

If the wafers W in the first exposure unit 110 are to undergo the first exposure process, the inherent error value $\theta 1$ of the first exposure unit 110 is selected. Then, the misalignment of the flat zone of each wafer W is compensated for (second compensation) based on the inherent error value of the first exposure unit 110 (S230). In particular, each wafer W is transferred by the first wafer transfer unit 400 from the carrier 150 of the first exposure unit 110 to the flat zone alignment apparatus 300 and there, the wafer W is rotated by an angle corresponding to the inherent error value of the first exposure unit 110. Then, the wafer W is transferred by the second transfer device 500 to the wafer stage 600 where the first exposure process is performed (S300). At this time, any misalignment of the flat zone of the wafer W may be additionally compensated for while the wafer W is disposed on the wafer stage 600 by rotating the chuck 610 by an amount corresponding to an inherent error value (S310). Next, images of a desired (circuit) pattern and alignment mark are transferred to the wafer W disposed on the wafer stage 600. The wafer W is then removed from the wafer stage 600 by the second wafer transfer device 500, and is subsequently processed (developed and etched). These wafers W in the first exposure unit 110 are sequentially pre-aligned and exposed in this way, i.e., steps S230, S300, S310 are repeated for each of the remaining (24) wafers W in the carrier 150 of the first exposure unit 110.

Then, a determination is made as to whether there are any more exposure units 100 loaded with a lot of wafers (S320). If yes, the next exposure unit, e.g., the second exposure unit 120, in the sequence is selected and the above-described process is performed on the wafers loaded in that exposure unit 120. The operation continues until the equipment runs out of wafers, i.e., until all of the exposure units 110, 120, . . . n are exhausted. Then, new lots of wafers are loaded into the equipment (S330).

In accordance with the present invention, as described above, an inherent error value for each exposure unit is calculated, and the calculated inherent error value of a particular exposure unit is used to pre-align the wafers loaded in that particular unit. Thus, inherent flaws in the exposure unit which would otherwise cause the wafers to be misaligned are compensated for.

In this way, the wafers can be promptly and accurately pre-aligned and alignment marks can be formed regularly on the wafers while the wafers undergo a first exposure process. Therefore, it becomes unnecessary to search for the for alignment marks when the second exposure process is performed. As a result, the present invention contributes to increasing the yield of the overall manufacturing process. In fact, the inherent error values calculated and applied in accordance with the present invention reduce alignment errors to within 1%, which represents a significant improved over conventional exposure equipment.

Finally, although the present invention has been particularly shown and described with reference to the preferred embodiments thereof, various changes in form and details will be it will be apparent to those of ordinary skill in the art. Thus, various changes to the preferred embodiments are seen to be within the true spirit and scope of the present invention as defined by the following claims.

What is claimed is:

1. A wafer pre-alignment method comprising:

transferring wafers from a standby location in an exposure unit to an alignment apparatus, detecting the relative angular positions of the wafers at the alignment apparatus, respectively, controlling the alignment apparatus to adjust the relative angular positions of each of the wafers by respective amounts necessary to set each of the wafers in the same relative angular position, whereby misalignment of the wafers with respect to a reference position is first compensated for, returning each of the wafers to the standby location, and calculating an inherent error value for the exposure unit based on the relative angular positions of the wafers detected when the wafers are at the alignment apparatus; and subsequently transferring the wafers in the exposure unit from the standby location back to the alignment apparatus, and controlling the alignment apparatus to adjust the orientation of the wafers each by an amount corresponding to the inherent error value calculated for the exposure unit, whereby misalignment of the wafers with respect to the reference position is secondly compensated for.

2. The method according to claim 1, and further comprising determining whether the wafers in the exposure unit are to undergo a first exposure process, in which images of a desired pattern and an alignment mark are transferred to the wafer, before the wafers are transferred from the standby location, wherein the alignment mark is for use in aligning the wafers during a second exposure process carried out on the wafers after the first exposure process.

3. The method according to claim 2, further comprising sequentially transferring the wafers to a wafer stage of the exposure unit after the orientation of the wafers has been adjusted by the alignment apparatus, wherein the wafer stage is the stage of an exposure apparatus that exposes the wafers to light of a predetermined wavelength transmitted through a reticle and onto a wafer supported on the wafer stage, detecting the relative angular positions of the wafers on the wafer stage, respectively, and controlling the exposure apparatus on the basis of the detected relative angular positions of the wafers on the wafer stage to adjust the relative angular positions of each of the wafers on the wafer stage before the first exposure process is carried out on each of the wafers, whereby misalignment of the wafers with respect to a reference position are thirdly compensated for at the wafer stage of the exposure apparatus.

4. The method according to claim 1, wherein the detecting of the relative angular positions of the wafers at the alignment apparatus comprises detecting the orientation of flat zones of the wafers, respectively.

5. The method according to claim 4, wherein the calculating of the inherent error value of the exposure unit comprises averaging values of angles by which the flat zones of the wafers that were transferred to the alignment apparatus from the standby position deviate from a reference position.

6. A wafer pre-alignment method comprising:

grouping wafers in lots and loading the lots of wafers into a plurality of exposure units, respectively, such that each of the lots is disposed at a respective standby location in each of the exposure units;

selecting one of the exposure units;

transferring wafers one-by-one from the respective standby location in the selected exposure unit to an alignment apparatus, detecting the relative angular position of the wafers at the alignment apparatus, controlling the alignment apparatus to adjust the relative angular positions of each of the transferred wafers by respective amounts necessary to set each of the wafers in the same relative angular position, whereby misalignment of the transferred wafers with respect to a reference position are first compensated for, returning each of the wafers to the standby location in the selected exposure unit after the misalignment of the wafer has been first compensated for, and calculating an inherent error value for the selected exposure unit based on the detected relative angular positions of the wafers that were transferred to the alignment apparatus from the standby position in the selected exposure unit;

subsequently transferring the wafers in the selected exposure unit from the standby location back to the alignment apparatus, and controlling the alignment apparatus to adjust the respective orientations of the wafers in the selected exposure unit each by an amount corresponding to the inherent error value calculated for the exposure unit, whereby misalignment of the wafers in the selected exposure unit with respect to the reference position are compensated for; and repeating the above for each of the other exposure units such that respective inherent error values are calculated for each of the exposure units.

7. The method according to claim 6, wherein the detecting of the relative angular position of the wafers at the alignment apparatus comprises detecting the orientation of flat zones of the wafers, respectively.

8. The method according to claim 7, wherein the calculating of the inherent error value of each of the exposure units comprises averaging values of angles by which the flat zones of the wafers that were transferred to the alignment apparatus from the standby position in the selected exposure unit deviate from a reference position.

9. The method according to claim 8, and further comprising storing the inherent error values of the exposure units in an electronic memory as correlated with the exposure units.

10. The method according to claim 6, and further comprising newly selecting one of the exposure units after the inherent error values have been calculated for all of the exposure units; and determining whether the wafers in the newly selected exposure unit are to undergo a first exposure process in which images of a desired pattern and an alignment mark are transferred to the wafer, and wherein the adjusting of the orientation of the wafers each by an amount corresponding to the inherent error value calculated for the exposure unit is carried out when it is determined that the wafers in the newly selected exposure unit are to undergo the first exposure process.

* * * * *